United States Patent
Preikszas

(10) Patent No.: US 8,421,028 B2
(45) Date of Patent: Apr. 16, 2013

(54) DEVICE FOR DEFLECTING OR GUIDING IN A PARTICLE BEAM

(75) Inventor: Dirk Preikszas, Oberkochen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 224 days.

(21) Appl. No.: 12/733,931

(22) PCT Filed: Sep. 26, 2008

(86) PCT No.: PCT/EP2008/062967
§ 371 (c)(1),
(2), (4) Date: Mar. 29, 2010

(87) PCT Pub. No.: WO2009/043824
PCT Pub. Date: Apr. 9, 2009

(65) Prior Publication Data
US 2010/0258738 A1  Oct. 14, 2010

(30) Foreign Application Priority Data
Sep. 29, 2007  (DE) .................. 10 2007 046 783

(51) Int. Cl.
*H01J 37/30*  (2006.01)
(52) U.S. Cl.
USPC .................. 250/396 R; 250/492.2; 250/492.1
(58) Field of Classification Search ............... 250/396 R, 250/492.3, 396 ML, 311
See application file for complete search history.

(56) References Cited

U.S. PATENT DOCUMENTS

| | | | |
|---|---|---|---|
| 3,558,953 A * | 1/1971 | Minet | 313/432 |
| 3,622,741 A * | 11/1971 | Steigerwald | 219/121.27 |
| 4,044,254 A * | 8/1977 | Krisch et al. | 250/311 |
| 4,434,371 A | 2/1984 | Knauer | |
| 4,623,794 A | 11/1986 | Rose et al. | |
| 4,683,366 A * | 7/1987 | Harte et al. | 219/121.25 |
| 4,968,893 A * | 11/1990 | Yasuda et al. | 250/492.2 |
| 4,983,832 A | 1/1991 | Sato | |
| 5,041,731 A * | 8/1991 | Oae et al. | 250/396 ML |

(Continued)

FOREIGN PATENT DOCUMENTS

| | | |
|---|---|---|
| DE | 39 24 605 A1 | 2/1990 |
| DE | 42 43 489 A1 | 6/1994 |

(Continued)

OTHER PUBLICATIONS

Martin Müller, "Abstimmbare Halbleiterlaser und schmalbandige Laserarrays mit verteilter lateraler Rückkopplung" Würzburg 2003, 7 pgs. (contains abstract in English and machine translation of relevant part).

(Continued)

*Primary Examiner* — Nikita Wells
*Assistant Examiner* — Johnnie L Smith
(74) *Attorney, Agent, or Firm* — Muirhead and Saturnelli, LLC

(57) ABSTRACT

A device for deflecting a particle beam out of a beam axis, or for guiding a particle beam into the beam axis, has a simple design, requires little space, and additionally ensures that no area of an object that is not to be struck is struck by a particle beam. The device may include components in the following sequence along the beam axis: first deflection element, a magnetic apparatus for providing a magnetic field axially to the beam axis, and a second deflection element. A particle beam apparatus may have a device of this type.

37 Claims, 13 Drawing Sheets

U.S. PATENT DOCUMENTS

| | | | |
|---|---|---|---|
| 5,483,073 A | 1/1996 | Benner | |
| 5,721,432 A | 2/1998 | Satoh et al. | |
| 6,040,576 A | 3/2000 | Benner | |
| 6,278,124 B1 | 8/2001 | Penberth et al. | |
| 6,452,175 B1 | 9/2002 | Adamec | |
| 6,576,908 B1 * | 6/2003 | Winkler et al. | 250/396 R |
| 6,657,211 B2 | 12/2003 | Benner | |
| 2002/0020823 A1 * | 2/2002 | Chen | 250/492.3 |
| 2008/0078750 A1 * | 4/2008 | Boguslavsky et al. | 219/121.41 |
| 2009/0114839 A1 * | 5/2009 | LeChevalier | 250/396 R |

FOREIGN PATENT DOCUMENTS

| | | | |
|---|---|---|---|
| EP | 0 899 771 A2 | 3/1999 |
| EP | 1 172 837 A2 | 1/2002 |
| EP | 1 760 762 A1 | 3/2007 |
| GB | 2 339 070 A | 1/2000 |

OTHER PUBLICATIONS

David C. Joy, et al., Electron channeling patterns in the scanning electron microscope, J. Appl. Phys., vol. 53, No. 8, Aug. 1982, pp. R81-R122.

L. Reimer, et al., "Electron optics, structure and function of the scanning electron microscope", XP 002514137, New York 1977, (machine translation enclosed).

* cited by examiner

DEVICE FOR DEFLECTING OR GUIDING IN A PARTICLE BEAM

TECHNICAL FIELD

This application relates to a device for deflecting a particle beam away from a beam axis or for guiding a particle beam toward the beam axis. This application further relates to a particle beam apparatus having such a device.

BACKGROUND OF THE INVENTION

Lithography machines are known in the prior art in which patterns and structures may be applied to surfaces by way of exposure of materials (for example, exposure using a particle beam).

For such a lithography machine, a particle-beam deflection device is known in the prior art which is situated in the beam path of a lithography machine designed as a particle beam apparatus. In this prior-art particle beam apparatus, an electron beam is generated by an electron source, focused by lenses, and guided to an object. A blanking aperture and a deflection unit are situated in the beam path of the electron beam. This prior-art deflection unit has a plate-shaped design and combines magnetic deflection with electrostatic deflection. The purpose of the aforementioned prior art is to blank out the electron beam, so that parts of the object are not exposed during lithography.

Furthermore, it is known from the prior art that an electron beam is blanked with the aid of a blanking unit made up of two pairs of plates, positioned one on top of the other, and an aperture in between them.

With regard to the above-indicated prior art, reference is made to U.S. Pat. No. 4,434,371 as well as the dissertation of Dr. Martin Müller, "Abstimmbare Halbleiterlaser and schmalbandige Laserarrays mit verteilter lateraler Rückkopplung" (Tunable semiconductor lasers and narrow-band laser arrays with distributed lateral feedback), Würzburg 2003, pages 30-31.

The above-indicated combination of magnetic and electrostatic deflection units, however, is a quite complicated design and requires higher effort for controlling the electrostatic and magnetic deflection unit with regard to their tuning.

Furthermore, it is known from the prior art to provide a particle beam apparatus, equipped with a condenser lens and an objective lens, with a deflection device that has at least one pair of deflector plates or at least one pair of deflector coils. Thus the deflection device is situated between the condenser lens and the objective lens at a position on the beam axis of the particle beam apparatus. If two pairs of deflector plates are provided, then according to the prior art these are situated in series between the condenser lens and the objective lens (i.e., in the order condenser lens—pair of deflector plates—pair of deflector plates—objective lens) along the beam axis of the particle beam apparatus. With these prior-art deflection devices, deflection of a particle beam is indeed possible; however, in this prior art, drift of the particle beam is quite likely. Drift of the particle beam is understood to mean movement of the impact point of the particle beam on the sample (or other object) after a deflection. After the deflection, the particle beam thus does not stay at the spot or does not stay in a very restricted region, but rather moves and thus may strike areas of a sample that should not really be exposed. This drift is particularly disadvantageous because small structures very close to each other may easily be damaged by this drift. This disadvantage is in particular a consequence of the required rapid control of the pair of deflector plates. Because of time delays in the control electronics, often it is not possible to precisely and rapidly control the pair or pairs of deflector plates in such a way that a sufficiently reliable deflection is assured. The positioning of the pairs of deflector plates relative to each other must also be very exact, so that a particle beam is no longer unintentionally moved after its deflection. This exact positioning could be implemented only at very high effort.

Another prior art is depicted in FIG. 1. FIG. 1 shows a prior-art particle beam apparatus in the form of a lithography machine having a deflection device for deflecting a particle beam. The prior-art particle beam apparatus has a beam source 1 which generates a particle beam 2. Particle beam 2 is guided to an object 3 with a suitable lens configuration (condenser, objective, not shown in FIG. 1) along a beam axis 8, which corresponds to the optical axis of the prior-art particle beam apparatus. Particle beam 2 may be deflected away from beam axis 8 with the aid of two crossed pairs of deflector plates, namely a first pair of deflector plates 4a,4b and a second pair of deflector plates 5a,5b, which form the deflection device. A voltage $V_1$ is applied to the first pair of deflector plates 4a,4b by a first voltage supply unit 6, while a voltage $V_2$ is applied to the second pair of deflector plates 5a,5b by a second voltage supply unit 7. A particular deflection of particle beam 2 from beam axis 8 is set by suitably selecting the ratio of voltages $V_1$ and $V_2$. Thus particle beam 2 is deflected in such a way that it is directed on object 3 in a direction in which additional exposure is not a problem, until the beam strikes blanking aperture 9 and thus is no longer directed to object 3. In many particle beam apparatuses, however, the available installation space is very limited, so often several pairs of deflector plates cannot be positioned simultaneously in one place in the same particle beam apparatus. Furthermore, because of signal delay times and stray capacitances in the voltage supply units, a particular ratio of voltages $V_1$ and $V_2$ might not always be ensured, so that a desired deflection of the particle beam is not achieved.

Therefore it would be desirable to provide a device for deflecting or guiding in a particle beam for a particle beam apparatus which has a simple design, requires little installation space, and furthermore ensures that no area of an object is exposed by a particle beam which is not supposed to be exposed.

SUMMARY OF THE INVENTION

The device is designed for deflecting a particle beam away from a beam axis or guiding a particle beam toward a beam axis according to the invention. At this point, it should be pointed out that a particle beam is understood to mean a beam having any type of particle (for example, ions, electrons, etc.). The device according to the invention has at least one deflection element. Furthermore, it has a particular order in which the individual units of the device are situated along the beam axis. As viewed from the first deflection element, at least one magnetic unit for providing a magnetic field and at least one second deflection element are situated along the beam axis. In other words, the device according to the invention has the following configuration along the beam axis, in order: first deflection element—magnetic unit—second deflection element. Furthermore, it is provided that the magnetic field of the magnetic unit is oriented parallel to the beam axis (i.e., an axial orientation along the beam axis). Thus, the beam axis is understood here to mean the axis along which the particle beam would travel without the influence of particle optics or other units altering the path. In addition, an essentially parallel orientation of the magnetic field relative to the beam axis, in which the orientation deviates slightly from completely parallel orientation, also falls within the scope of the invention.

Analysis has shown that good deflection of a particle beam, in which drift of the particle beam is avoided, is achieved if deflection elements for the particle beam are positioned in such a way that in order to solve the drift problem, we consider a virtual plane conjugate to an object plane (i.e., a plane in which an object lies), relative to a reference system formed by a deflection element (always called a virtual conjugate plane in the following). FIGS. 11 and 12 schematically show a layout according to the invention for a device having a beam source 1 generating particle beam 2 or particle beam bundle 2, a condenser lens 10, a first deflection element having first deflector plates 11a and 11b, a second deflection element having second deflector plates 16a and 16b, a blanking aperture 17, an objective lens 18, as well as an object 3. The device has a beam axis 8. For clarity, a magnetic unit is not shown. The layout of the device according to the invention will be described in greater detail below. In the reference system of first deflector plates 11a, 11b, the virtual conjugate plane CP lies above beam source 1. The virtual conjugate plane CP is also taken into account if drift of particle beam 2 is to be prevented, as explained in greater detail below. In some exemplary embodiments of the invention, the virtual conjugate plane may coincide with the real plane of the device that is conjugate to the object plane, where the real plane lies in the beam source region or at a crossover point of particles emitted by the beam source.

The device according to the invention first provides the configuration of two deflection elements which are situated practically "in series" along the beam axis. By exact positioning of the deflection elements relative to each other and predefinable control parameters, the virtual center of the particle beam deflection (virtual pivot point) may be placed at any point on the beam axis. Thus the virtual pivot point may also be placed in the virtual conjugate plane. This occurs by shifting the virtual pivot point or shifting the virtual conjugate plane. Thus the axial position of the virtual pivot point is determined by the ratio of the two amplitudes, which are predefined by the deflections of the two deflection elements.

In an embodiment, the first deflection element, the magnetic unit, and the second deflection element may be controlled in such a way that the virtual center of the particle beam deflection lies in a virtual conjugate plane relative to a predefined reference system (for example, the first deflection element), meaning here also the plane conjugate to the object plane. The first deflection element, the second deflection element, and the magnetic unit are controlled by suitable control parameters, for example a suitable current or a suitable voltage. The control parameters are thus coordinated in such a way that the virtual center of the particle beam deflection lies in the virtual conjugate plane relative to a reference system (for example, the first deflection element).

Now in order to prevent drift, the positioning of the deflection elements as well as their predefinable control parameters may need to be very exact, which results in higher effort. In order to avoid this, two corrective adjustments may be made based on the configuration according to the invention. The first adjustment relates to the location of the virtual conjugate plane. As already explained above, the configuration according to the invention ensures that the virtual center of the particle beam deflection (virtual pivot point) may be placed at any point on the beam axis. Thus the virtual pivot point may be placed in the virtual conjugate plane. By a corresponding adjustment of a suitable ratio of the amplitudes of the deflections of the deflection elements, it is always ensured that the virtual pivot point lies in the virtual conjugate plane. The above-described "particle beam tilt" about the pivot point may be readily achieved using the system described herein. In some particle beam apparatuses, in the first adjustment it is further provided that the location of the virtual conjugate plane has to be slightly shifted using the existing particle-optical elements. As a result, it is also ensured that the virtual pivot point is always located in the virtual conjugate plane. For particle beam apparatuses in which the location of the virtual conjugate plane cannot be affected, an approach is described below in greater detail.

The second adjustment relates to the orientation of the particle beam deflection relative to the beam axis. A sufficiently good orientation is ensured by the axial magnetic field of the magnetic unit. As mentioned above, the orientation or direction of the particle beam deflection may be adjusted using the device according to the invention. The provided magnetic field preferably has an effective length l and is adjustable in such a way that a Larmor precession of the particle beam occurs which is proportional to the intensity and length of the magnetic field:

$$\text{Larmor precession} \sim B \cdot l \qquad \text{[Equation 1]}$$

A desired orientation of the particle beam deflection is produced because of this magnetic field with the appropriate Larmor precession. Analysis has shown that the refraction power of the magnetic field satisfies the following condition:

$$\text{Refraction power} \sim B^2 \cdot l \qquad \text{[Equation 2]}$$

However, the refraction power is negligible because of the required small deflections and thus the small magnetic field.

The system described herein is also based on the idea that the ratio of the deflection amplitudes of the deflection elements and the orientation of the directions of the particle beam deflections are roughly predefined by the geometry of the deflection elements. Using the magnetic unit, a "fine adjustment" takes place in such a way that the particle beam stays in one place or moves only slightly, and thus drift is no longer an issue.

The aforementioned configuration of the individual elements of the device according to the invention and the corrective adjustments possible with the latter ensure that the particle beam is deflected to an aperture in such a way that drift of the particle beam and thus unintentional striking of the object by the particle beam is avoided. Essentially it is hereby achieved that the particle beam stays in one place or moves only within a region in such a way that drift is not an issue. Analysis has shown that the configuration according to the invention makes it possible for the particle beam to stay within a region of a few nanometers during blanking (deflection). This is particularly advantageous in processing and fabrication of very small structures in lithography machines.

In one embodiment of the invention, as viewed from the first deflection element, at least one blanking unit is situated behind the second deflection element. This blanking unit is preferably designed as an aperture. The particle beam may be guided in the region of the blanking unit in such a way that during deflection, the particle beam does not leave its original position in the object plane or moves only slightly away from it (i.e., does not drift from its original position).

However, the positioning of the blanking unit is not limited to the aforementioned configuration. On the contrary, any positioning of the blanking unit is preferred which is located behind the first deflection element (as viewed in the direction of the beam).

In another embodiment of the invention, the first deflection element has at least two first deflection units. Alternatively or in addition, it is provided that the second deflection element has at least two second deflection units. In another embodiment, the first deflection element is equipped with at least one plate-shaped deflection unit. For example, the two first deflection units of the first deflection element are plate-shaped, and form a pair of deflector plates. Alternatively or in addition, the second deflection element is provided with at least one plate-shaped deflection unit. Here it is also provided, for example, that the two second deflection units of the second deflection element are plate-shaped, which then form a pair of deflector plates.

As explained above, by suitably selecting different parameters of the first deflection element and the second deflection element, the virtual pivot point of the particle beam deflection may be placed at any point on the beam axis. The parameters include, for example, the length of both deflection elements, the distance between the deflection units of the individual deflection elements, as well as their polarity and the voltage supply unit. In an embodiment, the distance between the two deflection units of one or any deflection element may be approximately 1 mm to 10 mm, preferably 2 mm to 5 mm. It is further provided that the two first deflection units of the first deflection element and/or the two second deflection units of the second deflection element may have a length in the range from 5 mm to 60 mm, preferably in the range from 10 mm to 30 mm.

In another embodiment of the invention, the first deflection element has at least one first magnetic element. Alternatively or in addition, the second deflection element has at least one second magnetic element. For example, the first magnetic element and the second magnetic element are designed as deflector coils. This embodiment stems from the basic idea that the described effect may also be achieved using magnetic deflection elements.

It is further provided that a device according to an embodiment of the system described herein may have a first voltage supply unit for powering the first deflection element and a second voltage supply unit for powering the second deflection element. In an alternative embodiment, it is provided that the device may have a single voltage supply unit for jointly powering both the first deflection element and the second deflection element. The last-mentioned embodiment may be particularly advantageous because each voltage supply unit has a certain inaccuracy, so that in this way errors in control of the first deflection element and the second deflection element may appear, which in turn affects the particle beam deflection. Such errors are reduced by using a single voltage supply unit.

Voltages $V_1$ and $V_2$ applied by the first and second voltage supply units are parameters which, if suitably selected, will result in the virtual pivot point lying in the virtual conjugate plane.

In a particular embodiment, the magnetic field of the magnetic unit may be generated with the aid of at least one coil element which is part of the magnetic unit. At least one pole shoe may be provided in the magnetic unit, which supports the at least one coil element in generating the magnetic field. However, it should be explicitly pointed out that the system described herein is not limited to the magnetic field being generated in the aforementioned way. On the contrary, the magnetic field may be generated in any way.

In an embodiment, the magnetic field of the magnetic unit is designed in such a way that it penetrates the first deflection element and/or the second deflection element. In this embodiment, it is advantageous that penetration of the magnetic field does not have to be prevented by expensive measures (for example, by placing very small holes in the pole shoes and/or by a large distance between the magnetic unit with its magnetic field and the deflection elements). By not taking these measures, installation space is saved, in particular in the axial direction (i.e., essentially along the optical axis of the particle beam apparatus). However, it should be explicitly pointed out that the above-described penetration of the magnetic field is not mandatory for the system described herein. On the contrary, the system described herein may also be implemented without penetration of the magnetic field.

In a particular embodiment of the invention, the magnetic unit is designed as a round lens. For example, this is a magnetic round lens of a particle beam apparatus in which the device according to the invention is situated. The magnetic round lens provides the magnetic field. Here it is advantageous that an already existing particle-optical element may be used in connection with the system described herein, so that components may be saved.

Another embodiment of the invention in particular is then provided if the location of the virtual conjugate plane cannot be affected. Thus, the magnetic unit of this further embodiment of the invention has at least one first region with a first magnetic field and at least one second region with a second magnetic field. The magnetic field already mentioned above is in principle split into these two magnetic fields. The first magnetic field is oriented axially in the opposite direction relative to the second magnetic field. Because the magnetic field dependence of the refraction power does not involve a sign and the magnetic field dependence of the Larmor precession does involve a sign, by suitably selecting the first magnetic field and the second magnetic field without varying the Larmor precession, the refraction power is increased in such a way that the required ratio of the deflection amplitudes may match the existing amplitude ratio. Thus the virtual pivot point is shifted.

In another embodiment of the invention, the first deflection element and/or the second deflection element is/are situated in such a way that they at least partially overlap the magnetic unit. For example, the first deflection element and/or the second deflection element is/are inserted into the magnetic unit. This embodiment in particular is then advantageous if a lens that already exists in a particle beam apparatus is used as the magnetic unit. This embodiment ensures that the invention functions properly even with little available installation space.

The system described herein also relates to a particle beam apparatus including a device having at least one of the aforementioned features or combinations of features. Thus it is provided that the particle beam apparatus has at least one particle source for generating a particle beam. The particle beam apparatus is further equipped with at least one objective lens and preferably with at least one condenser lens.

The particle beam apparatus according to the invention as specified by the aforementioned exemplary embodiments may be designed as a lithography machine. The particle beam apparatus in particular may be designed as an electron beam apparatus. Alternatively to this, the particle beam apparatus may be designed as an ion beam apparatus.

The system described herein also relates to a sample processing apparatus that is equipped with at least one particle source for generating a particle beam and with a device for deflecting the particle beam away from a beam axis of the sample processing apparatus or for guiding a particle beam toward the beam axis. Furthermore, the device has at least one deflection element as well as at least one magnetic unit for providing a magnetic field oriented parallel to the beam axis; for this, reference is made to the explanations given above. In addition, the sample processing apparatus is equipped with at least one objective lens. As viewed from the particle source, the deflection element, the magnetic unit, and the objective lens are situated on the beam axis. The provided magnetic field may be adjustable in such a way that a Larmor precession of up to ±90° is produced, and even more specifically, a Larmor precession of up to ±45°.

This embodiment of the invention also ensures that no undesired exposures occur during blanking of the particle beam. For this purpose, during blanking the particle beam is guided in a direction in which additional exposure is not a problem. Because of the possibility that the deflection element may be accordingly affected (for example, by a reversal in polarity), a Larmor precession of max ±90° provided by an adjustable magnetic field is sufficient in order to adjust any possible particle beam deflection direction during blanking. The provided magnetic field preferably is adjustable in such a way that a Larmor precession ranging from up to ±45° or exactly ±45° is produced. This embodiment ensures, for an appropriately controlled deflection element, that the particle beam is oriented in certain preferred directions.

In another particular embodiment of the sample processing apparatus, the deflection element has at least two deflection units. At least one deflection unit has preferably a plate-shaped design. For example, both deflection units have a plate-shaped design, and therefore form a pair of deflector plates.

Furthermore, the sample processing apparatus may be equipped with a voltage supply unit for powering the deflection element.

In a particular embodiment of the sample processing apparatus, the magnetic field of the magnetic unit may be generated with the aid of at least one coil element which is part of the magnetic unit. At least one pole shoe may also be provided in the magnetic unit, which for example supports the at least one coil element for generating the magnetic field. However, it should be pointed out that the system described herein is not limited to this generation of the magnetic field. On the contrary, the magnetic field may be generated in any way. In a further embodiment, the magnetic field of the magnetic unit is designed in such a way that it penetrates the deflection element.

In a particular embodiment of the sample processing apparatus, the magnetic unit is designed as a round lens. For example, this is a magnetic round lens of a particle beam apparatus in which the deflection device (or guidance device) is situated. The magnetic round lens provides the magnetic field having the appropriate Larmor precession. Here it is advantageous that an already existing particle-optical element may be used for the system described herein, so that components may be saved.

BRIEF DESCRIPTION OF THE DRAWINGS

Embodiments of the system described herein are explained in greater detail below using the figures, which are briefly described as follows.

DETAILED DESCRIPTION OF VARIOUS EMBODIMENTS

The exemplary embodiments described below of devices for deflecting and guiding in a particle beam (hereinafter also only called deflection devices) are situated in particle beam apparatuses which are designed as lithography machines. Therefore the exemplary embodiments depicted in the figures are electron beam apparatuses or ion beam apparatuses. But the particle beam apparatuses depicted in the figures or also the particle beam apparatus already described above may also be designed, for example, as a scanning electron microscope or also as a transmission electron microscope, because in some cases blanking an electron beam is required in such apparatuses in order to prevent damage to a sample to be examined.

Figure 1:
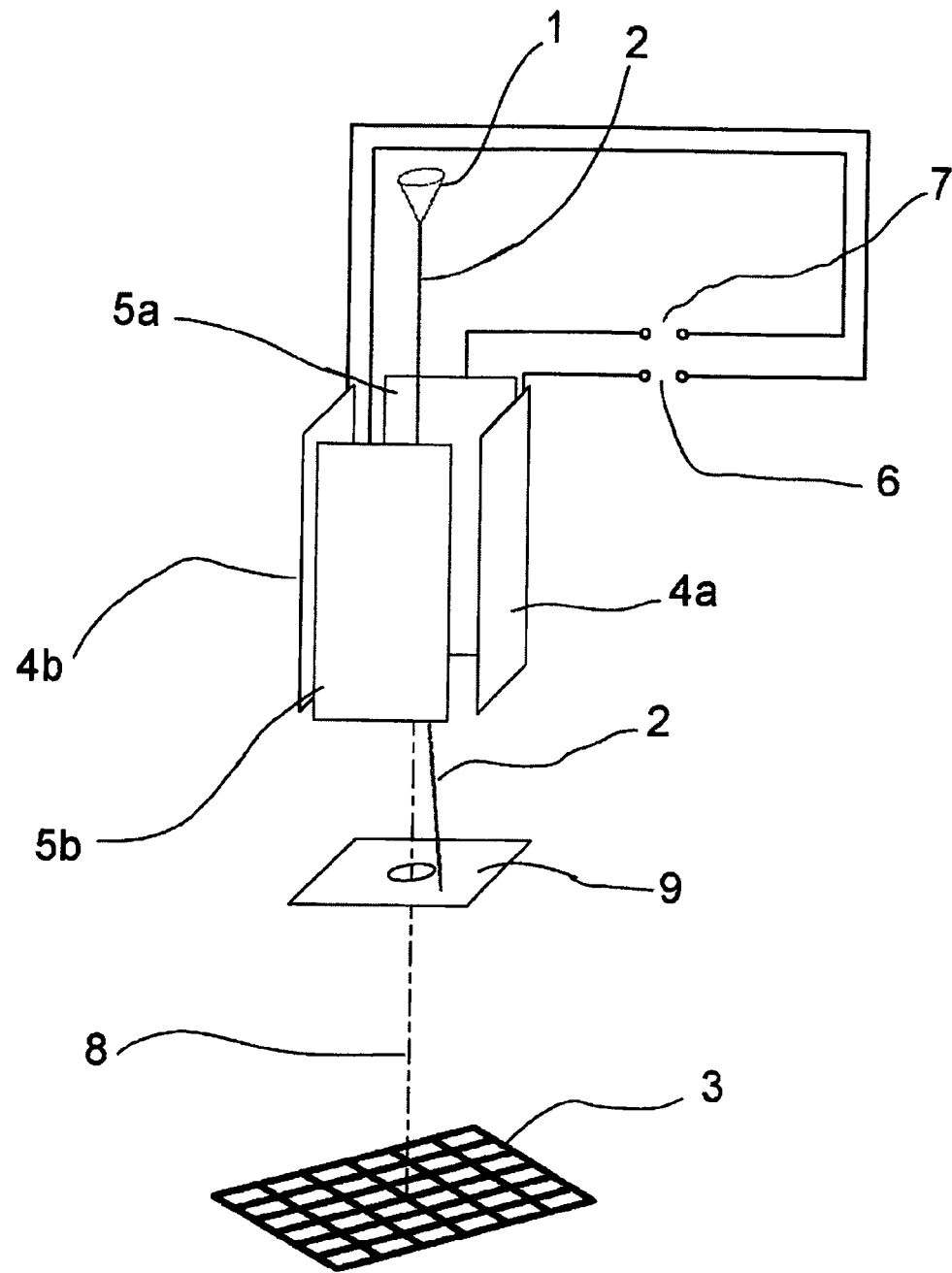
FIG. 1 shows a particle beam apparatus having a deflection device according to the prior art.
Figure 2:
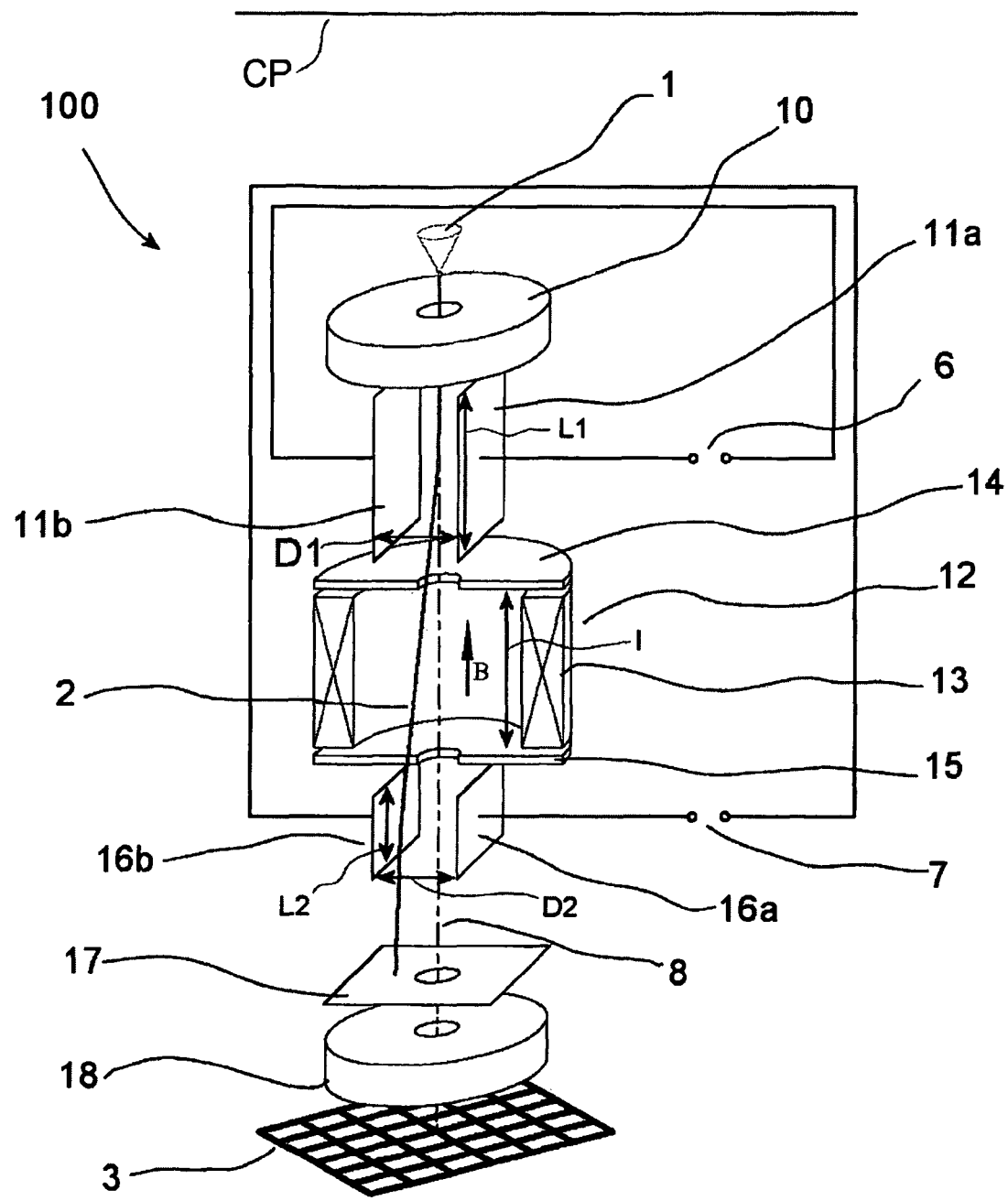
FIG. 2 shows a particle beam apparatus having a device according to the invention for deflecting and guiding in a particle beam as well as having two voltage supply units.

FIG. 2 shows a particle beam apparatus 100 which has a beam source 1 for generating a particle beam 2. Furthermore, the particle beam apparatus 100 is equipped with a condenser lens 10 and an objective lens 18. The mode of operation for condenser lens 10 and objective lens 18 has been known in the prior art for a long time, so we will not deal with it further here. As viewed from beam source 1, a first deflection element is situated along beam axis 8 behind condenser lens 10, the deflection element being made up of two opposite first deflector plates 11a and 11b. First deflector plates 11a and 11b are essentially identical in design, and each have length L1 in the range of approximately 20 mm. Distance D1 between first deflector plates 11a and 11b is approximately 4 mm for this exemplary embodiment. In an alternative embodiment of the first deflection element, both first deflector plates 11a and 11b have length L1 in the range of approximately 10 mm, the two first deflector plates 11a and 11b being approximately 2 mm apart. Length L1 of first deflector plates 11a and 11b is measured along beam axis 8. Distance D1 between the two first deflector plates 11a and 11b is measured perpendicular to beam axis 8. The first deflection element therefore forms a pair of deflector plates.

Behind first deflector plates 11a, 11b, a magnetic unit 12 is situated along beam axis 8 which has two pole shoe plates 14 and 15 as well as a coil element 13. Magnetic unit 12 is designed as a magnetic round lens and generates a magnetic field B, which is oriented parallel to beam axis 8 (i.e., axially relative to beam axis 8). This will be discussed in greater detail below.

As viewed from beam source 1, a second deflection element is situated along beam axis 8 behind magnetic unit 12. The second deflection element has two opposite second deflector plates 16a and 16b, which form a pair of deflector plates. The two second deflector plates 16a and 16b are a distance D2 of approximately 4 mm apart. Both second deflector plates 16a and 16b are also essentially identical in design and have a length L2 of approximately 10 mm. Length L2 of second deflector plates 16a and 16b is measured along beam axis 8. Distance D2 between second deflector plates 16a and 16b is measured perpendicular to beam axis 8.

In the exemplary embodiment depicted in FIG. 2, the distance from beam source 1 to a central point midway between a front edge and a rear edge of first deflector plates 11a and 11b is approximately 100 mm. The front edge in this case is facing beam source 1. The central point midway between first deflector plates 11a, 11b is the point at which deflection of the particle beam effectively occurs. Since length L1 of first deflector plates 11a and 11b for the exemplary embodiment depicted is 20 mm, the distance between the front edge and beam source 1 is therefore approximately 90 mm.

Furthermore, the distance between beam source 1 and a central point midway between a front edge and a rear edge of second deflector plates 16a and 16b is approximately 250 mm. The front edge in this case is facing beam source 1. The central point midway between second deflector plates 16a and 16b is the point at which deflection of the particle beam effectively occurs. Since length L2 of second deflector plates 16a and 16b is approximately 10 mm, the distance between the front edge and beam source 1 is approximately 245 mm.

Figure 9:
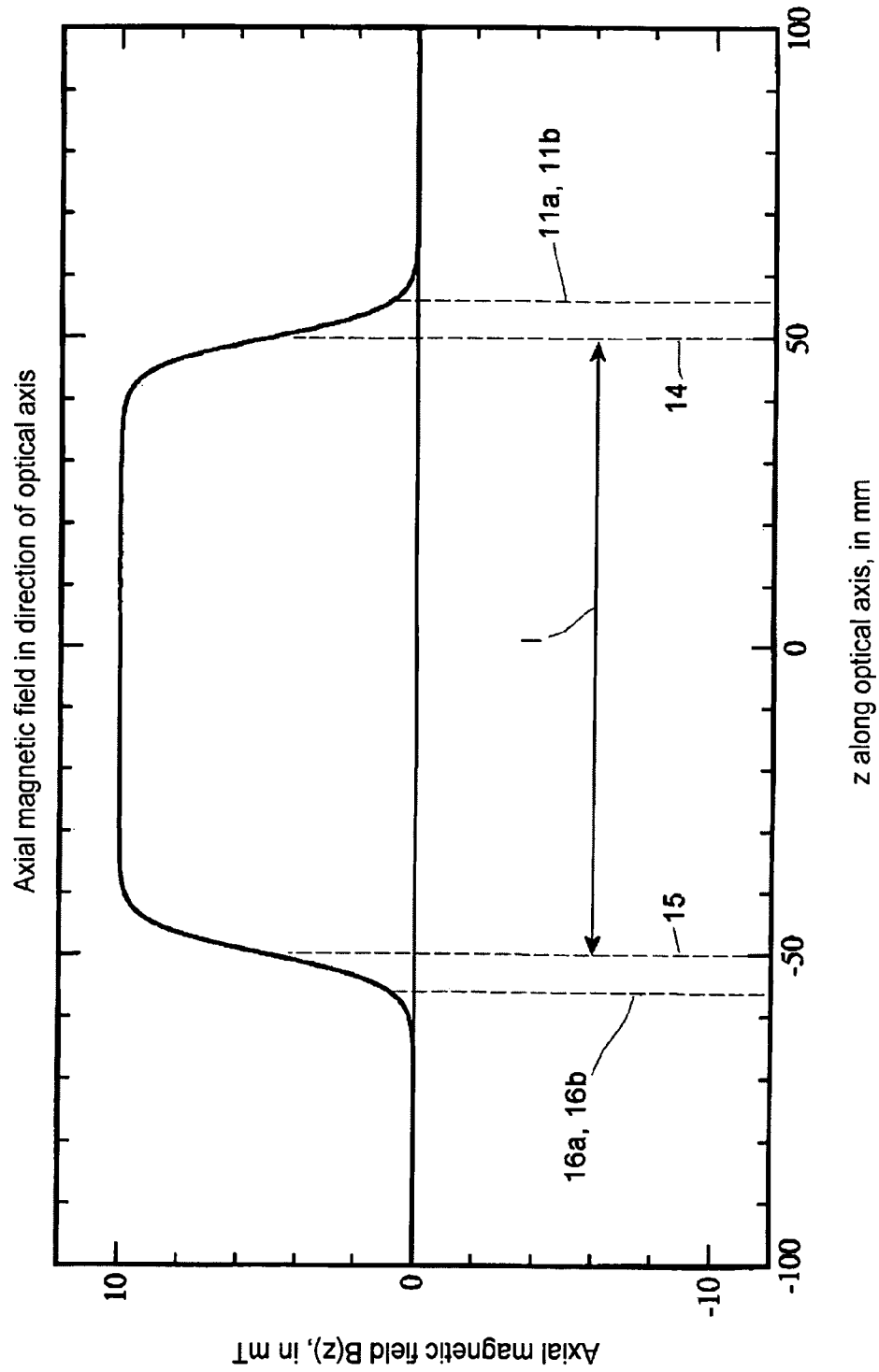
FIG. 9 shows a curve of a magnetic field of the device as in FIG. 2.

The above-indicated magnetic round lens is part of particle beam apparatus 100 and has other functions, but there is no interference with such functions due to the function essential to the invention. The orientation of magnetic field B is identified in FIG. 2 by an arrow. Magnetic field B in this case is designed in such a way that it penetrates both the first deflection element having first deflector plates 11a and 11b and also the second deflection element having second deflector plates 16a and 16b and has effective length l, which essentially corresponds to the distance between the two facing sides of pole shoe plates 14 and 15. The exact curve of magnetic field B, which is on the order of magnitude of a few milliteslas, is shown in FIG. 9. The magnetic field intensity B is plotted in that figure as a function of the z axis, which runs along beam axis 8 or the optical axis. Here the zero point is the center of magnetic unit 12. The position of pole shoe plate 14 is approximately z=50 mm, while the position of pole shoe plate 15 is approximately z=−50 mm. Effective length l for this exemplary embodiment is therefore approximately 100 mm. The penetration of magnetic field B is also apparent from FIG. 9. FIG. 9 thus shows the approximate positions of first deflector plates 11a and 11b as well as second deflector plates 16a and 16b, at which a certain magnetic field B still exists.

As already mentioned above, penetration of magnetic field B is not mandatory for the invention. However, it is a preferred feature of the invention and advantageous here, since no extensive measures have to be taken to minimize penetration. Thus installation space is saved.

Behind second deflector plates 16a and 16b (again, as viewed from beam source 1) are situated blanking aperture 17 and objective lens 18, which focus particle beam 2 (for example, an electron beam or ion beam) onto an object plane, in which object 3 is located. This may occur if the system made up of condenser lens 10, magnetic unit 12, and objective lens 18 form an image of beam source 1 or its "crossover" (i.e., the point near beam source 1 at which the particles emitted by beam source 1 have the smallest beam diameter perpendicular to beam axis 8) in the object plane. Therefore, particle beam apparatus 100, as viewed from beam source 1, has the following configuration, in order: first deflector plates 11a and 11b—magnetic unit 12—second deflector plates 16a and 16b—blanking aperture 17—objective lens 18—object 3.

The relative orientation of both deflection elements (i.e., the relative orientation of the first deflection element and the second deflection element) for the exemplary embodiment depicted here is 0° (where the voltage ratio here is $V_1/V_2=-1$, which will be dealt with in greater detail below). Alternatively, for this purpose it is provided that both deflection elements are oriented by 180° relative to each other (where the voltage ratio here is $V_1/V_2=1$, which will be dealt with in greater detail below).

Furthermore, for the aforementioned exemplary embodiment, condenser lens 10 is energized to some extent. Magnetic unit 12 is only very slightly energized.

The pair of deflector plates made up of first deflector plates 11a and 11b in this exemplary embodiment is powered with voltage $V_1$ via a first voltage supply unit 6. Furthermore, a second voltage supply unit 7 is provided which applies a voltage $V_2$, and is provided for powering the pair of deflector plates made up of second deflector plates 16a and 16b. Leads connect first deflector plates 11a and 11b accordingly to first voltage supply unit 6. At the same time, leads connect second deflector plates 16a and 16b to second voltage supply unit 7.

The virtual plane CP conjugate to the object plane lies slightly above beam source 1 with respect to the reference system formed by the first pair of deflector plates 11a, 11b. The location of this virtual conjugate plane CP in the depicted exemplary embodiment may be shifted slightly by adjustment of the existing particle-optical units in particle beam apparatus 100, in particular condenser lens 10. Condenser lens 10 is situated between beam source 1 and the first pair of deflector plates 11a, 11b and (as mentioned above) is generally slightly energized. Accordingly, the virtual conjugate plane CP is shifted away from object 3.

If the energizing of condenser lens 10 is changed, then the energizing of objective lens 18 must also be changed to maintain the focus of particle beam 2 in the object plane. The plane of beam source 1 thus always stays conjugate to the object plane. Between condenser lens 10 and objective lens 18, however, particle beam 2 changes and the virtual focal plane is shifted in this region. This virtual focal plane is also the plane (virtual conjugate plane) which is relevant for the first and second deflection elements. By suitably selecting the location of the virtual conjugate plane, the deflection of particle beam 2 may be adjusted, as is explained below.

With the aid of first voltage supply unit 6 and second voltage supply unit 7, the ratio of voltages $V_1$ and $V_2$ (as indicated above) is adjusted in such a way that because of the deflection amplitude ratio for first deflector plates 11a, 11b or second reflector plates 16a, 16b, the virtual pivot point lies at a desired point on beam axis 8 in the virtual conjugate plane CP (thus the axial position of the pivot point may be adjusted). The position is adjusted by shifting the virtual conjugate plane. As mentioned already, the virtual conjugate plane CP lies above beam source 1 in the depicted exemplary embodiment. The location of the virtual conjugate plane CP also is affected by energizing of condenser lens 10, energizing of objective lens 18 being always readjusted so that focusing of particle beam 2 on object 3 is maintained. The azimuthal orientation toward beam axis 8 of the deflection of particle beam 2 on object 3, caused by first deflector plates 11a and 11b, is provided by the magnetic field B applied by magnetic unit 12.

Figure 3:
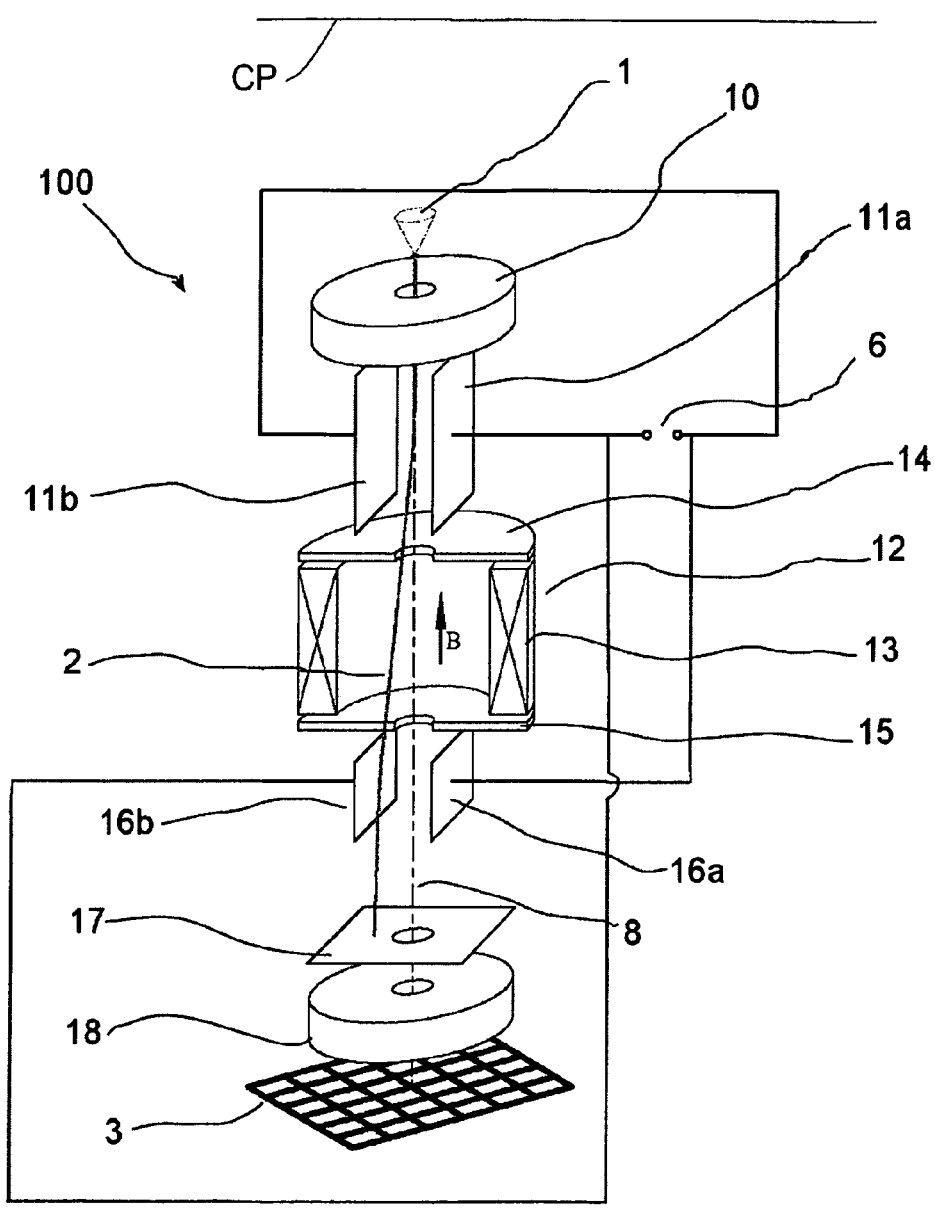
FIG. 3 shows a particle beam apparatus as in FIG. 2, but having only one voltage supply unit.

FIG. 3 depicts an exemplary embodiment very similar to the exemplary embodiment according to FIG. 2, where the same reference numerals are used to denote the same components. The exemplary embodiment depicted in FIG. 3 differs from the exemplary embodiment depicted in FIG. 2 only in that voltage is applied to first deflector plates 11a, 11b as well as second deflector plates 16a and 16b from a single voltage supply unit, namely first voltage supply unit 6. Apart from that, the features of the exemplary embodiment according to FIG. 3, in particular the design of first and second deflector plates 11a, 11b, 16a, and 16b, is identical to that of the exemplary embodiment according to FIG. 2. A difference from the exemplary embodiment according to FIG. 2 is that a voltage ratio cannot be adjusted, since only a single voltage supply unit 6 is used. Therefore a fixed voltage ratio is specified. In the exemplary embodiment depicted here, a ratio of $V_1/V_2=1$ is specified (relative orientation of the two deflection elements, by 180°). The exemplary embodiment according to FIG. 3 has the advantage that errors due to possible inaccuracies in the voltage ratio for multiple voltage supply units, which affect adjustment of the virtual pivot point, are reduced. In the nanosecond range, it is always actually possible to ensure a fixed voltage ratio. Analysis has shown that this is best implemented in short-circuited first and second deflector plates 11a, 11b, 16a, and 16b (i.e., for a fixed voltage ratio of $V_1/V_2=1$ or $V_1/V_2=-1$). The invention ensures that particle beam 2 stays on object 3 within a negligibly small region (nanometer range) during blanking. In an alternative embodiment of this exemplary embodiment, it is provided that the second deflection element must guide particle beam 2 back half as strongly as the first deflection element deflects particle beam 2. In this alternative embodiment, the first deflection element and the second deflection element may then have an identical design as far as dimensions are concerned, and $V_1/V_2=-2$ may be chosen as the voltage ratio. However, the length of the second deflection element may also be halved and $V_1/V_2=-1$ may be chosen as the voltage ratio.

Figure 4:
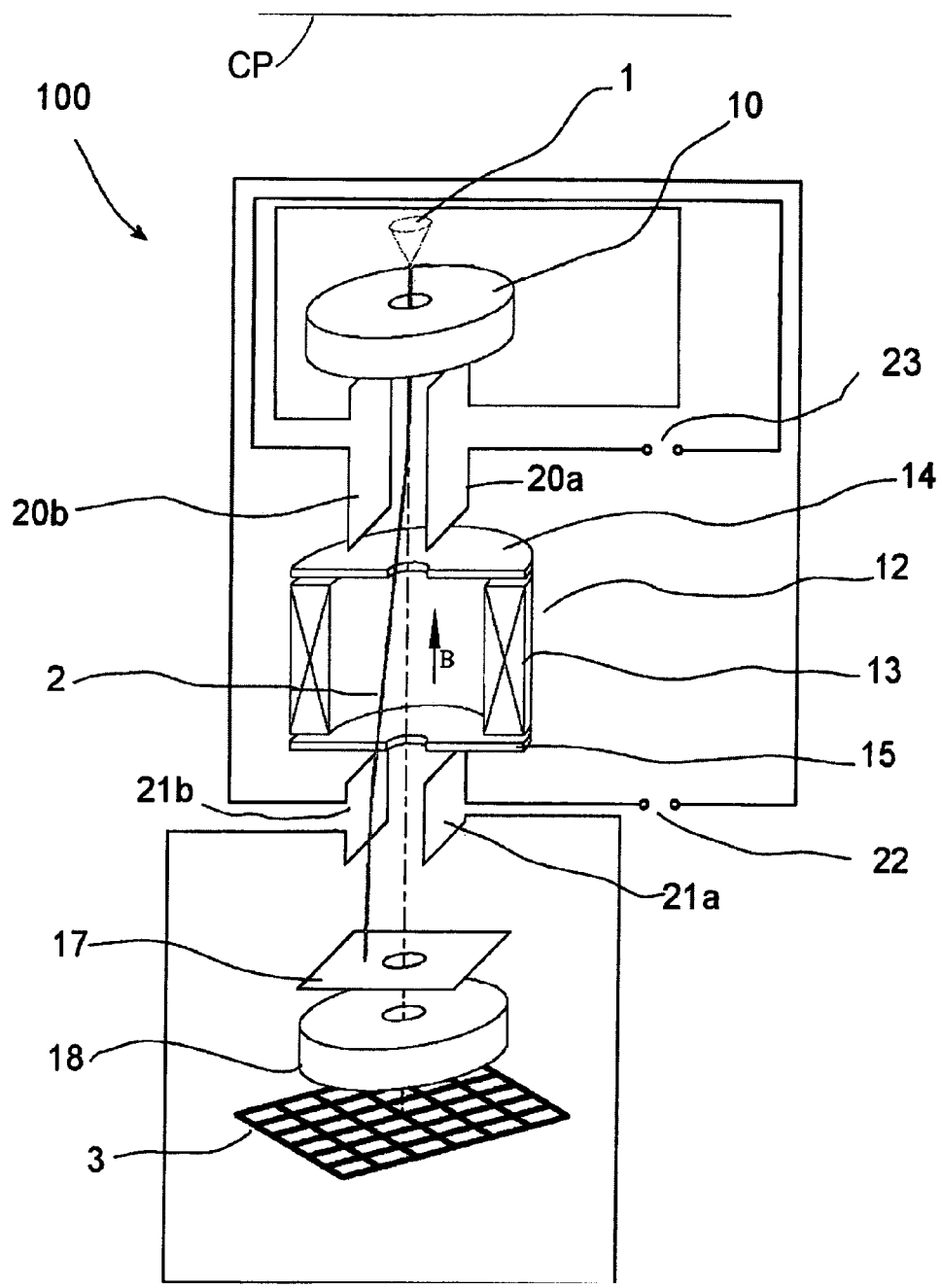
FIG. 4 shows a particle beam apparatus as in FIG. 2, but having coil elements.

FIG. 4 depicts another exemplary embodiment very similar to the exemplary embodiment according to FIG. 2, where the same reference numerals are used to denote the same components. The exemplary embodiment depicted in FIG. 4 differs from the exemplary embodiment depicted in FIG. 2 only in that instead of deflector plates, first coil elements 20a, 20b and second coil elements 21a, 21b are used for generating a deflecting magnetic field, which are powered by corresponding first and second power supply units 22 and 23.

Figure 5:
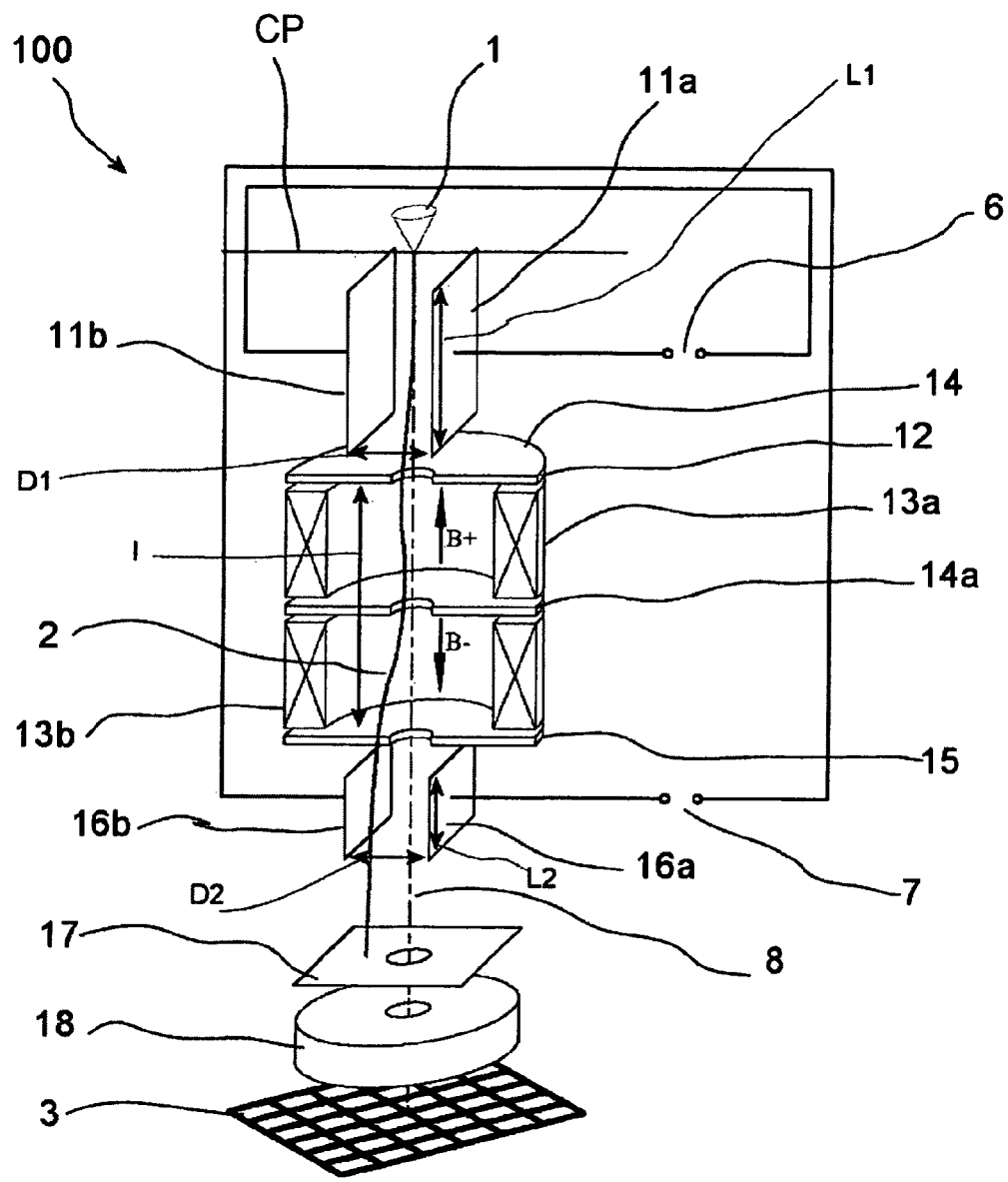
FIG. 5 shows a particle beam apparatus having a device for deflecting and guiding in a particle beam having oppositely directed magnetic fields and having two voltage supply units.

Another exemplary embodiment is depicted in FIG. 5. FIG. 5 shows a particle beam apparatus 100, where again the same reference numerals denote the same components. This exemplary embodiment is also equipped with a beam source 1 for generating a particle beam 2 and has a beam axis 8, along which additional components of particle beam apparatus 100 are situated in a certain order, as viewed from beam source 1. A first deflection element having two opposite first deflector plates 11a and 11b is again situated behind beam source 1, followed by magnetic unit 12. The first deflection element therefore forms a pair of deflector plates. First deflector plates 11a and 11b are essentially identical in design, and each have length L1 in the range of approximately 30 mm. Distance D1 between first deflector plates 11a and 11b is approximately 4 mm for this exemplary embodiment. In an alternative embodiment of the first deflection element, both first deflector plates 11a and 11b have length L1 in the range of approximately 15 mm, the two first deflector plates 11a and 11b having a distance D1 of approximately 2 mm between them. Length L1 of first deflector plates 11a and 11b is measured along beam axis 8. Distance D1 between first deflector plates 11a and 11b is measured perpendicular to beam axis 8.

A second deflection element having two opposite second deflector plates 16a and 16b is positioned downstream magnetic unit 12, followed by blanking aperture 17. The two second deflector plates 16a and 16b are a distance D2 of approximately 4 mm apart. Both second deflector plates 16a and 16b also are of essentially identical design and have length L2 of approximately 10 mm. Length L2 of second deflector plates 16a and 16b is measured along beam axis 8. Distance D2 between second deflector plates 16a and 16b is measured perpendicular to beam axis 8.

Objective lens 18 is situated behind blanking aperture 17, and object 3 is situated behind the objective lens. Object 3 lies in an object plane. Thus particle beam apparatus 100, as viewed from beam source 1, has the following configuration of components, in order: first deflection element having first deflector plates 11a and 11b—magnetic unit 12—second deflection element having second deflector plates 16a and 16b—blanking aperture 17—objective lens 18—object 3.

In the exemplary embodiment depicted in FIG. 5, the distance between beam source 1 and a central point midway between a front edge and a rear edge of first deflector plates 11a and 11b is approximately 50 mm, the central point for individual deflector plates being already defined above. The front edge in this case is facing beam source 1. At a length L1 of approximately 30 mm for first deflector plates 11a and 11b, the distance between the front edge and beam source 1 is therefore approximately 35 mm.

The distance from beam source 1 to a central point midway between a front edge and a rear edge of second deflector plates 16a and 16b is approximately 200 mm, the central point being defined above. The front edge in this case is facing beam source 1. At a length L2 of approximately 10 mm for second deflector plates 16a and 16b, the distance between the front edge and beam source 1 is therefore approximately 195 mm.

Figure 10:
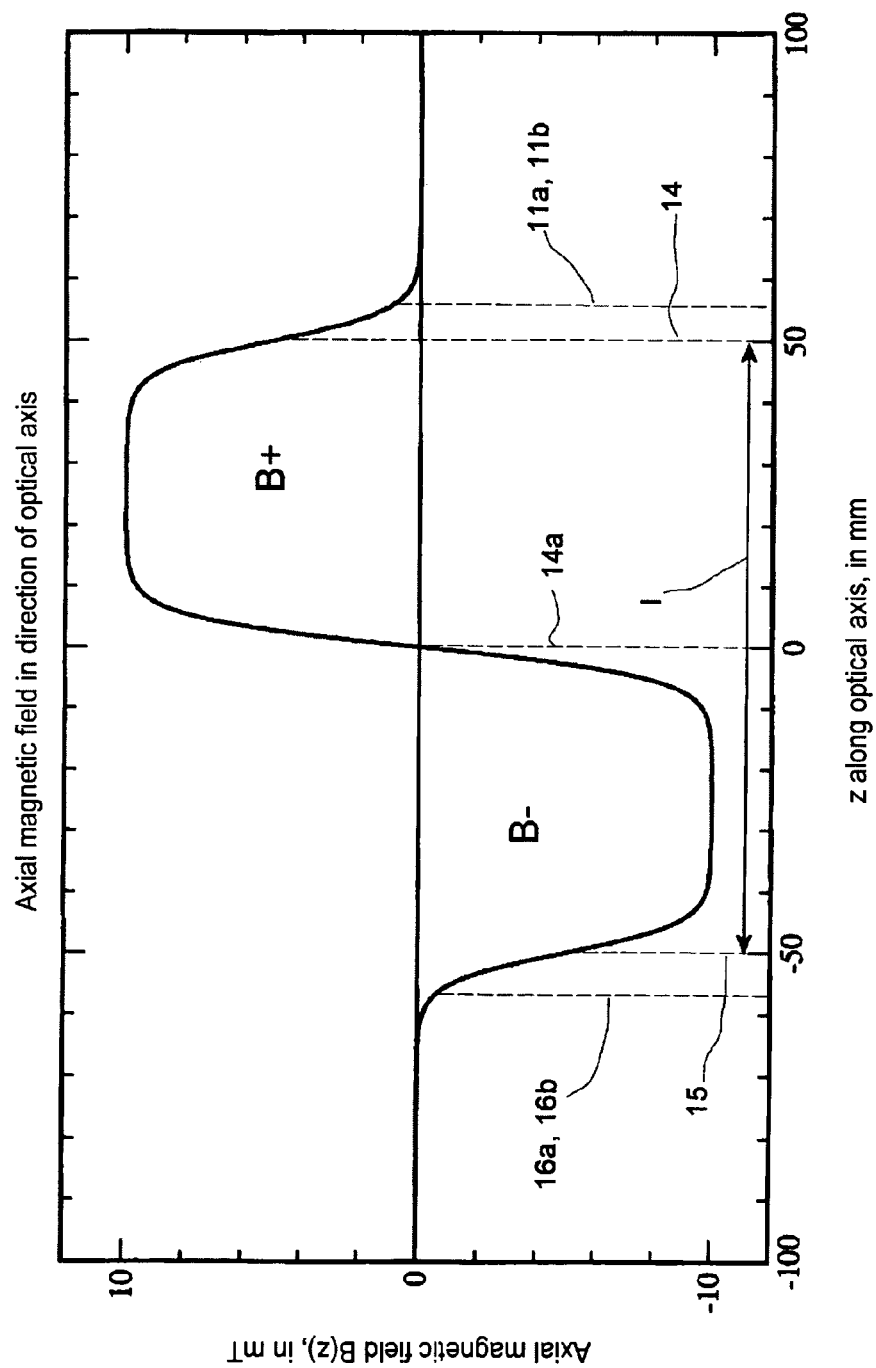
FIG. 10 shows a curve of a magnetic field of the device as in FIG. 5.
Figure 11:
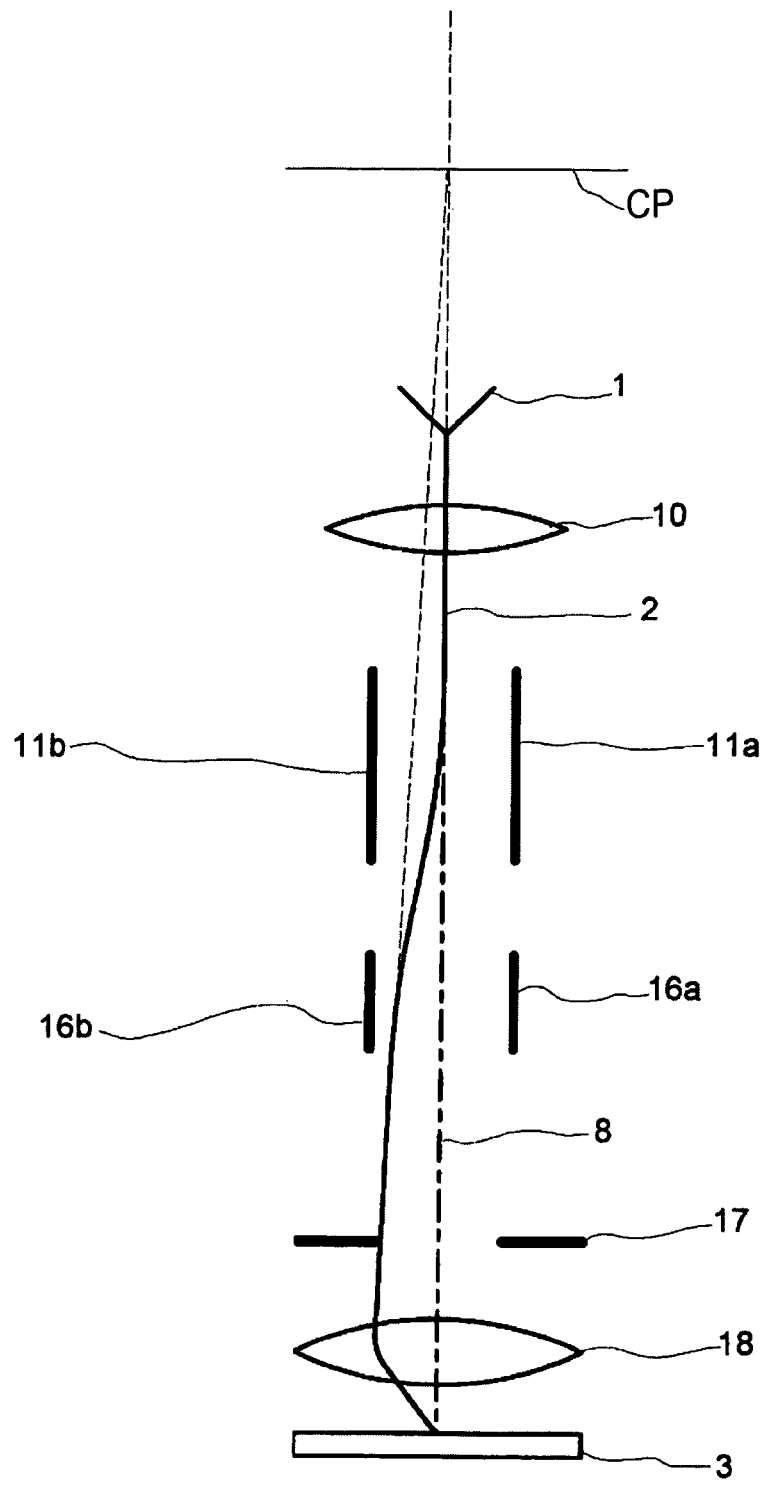
FIG. 11 shows a schematic layout of a particle beam apparatus.
Figure 12:
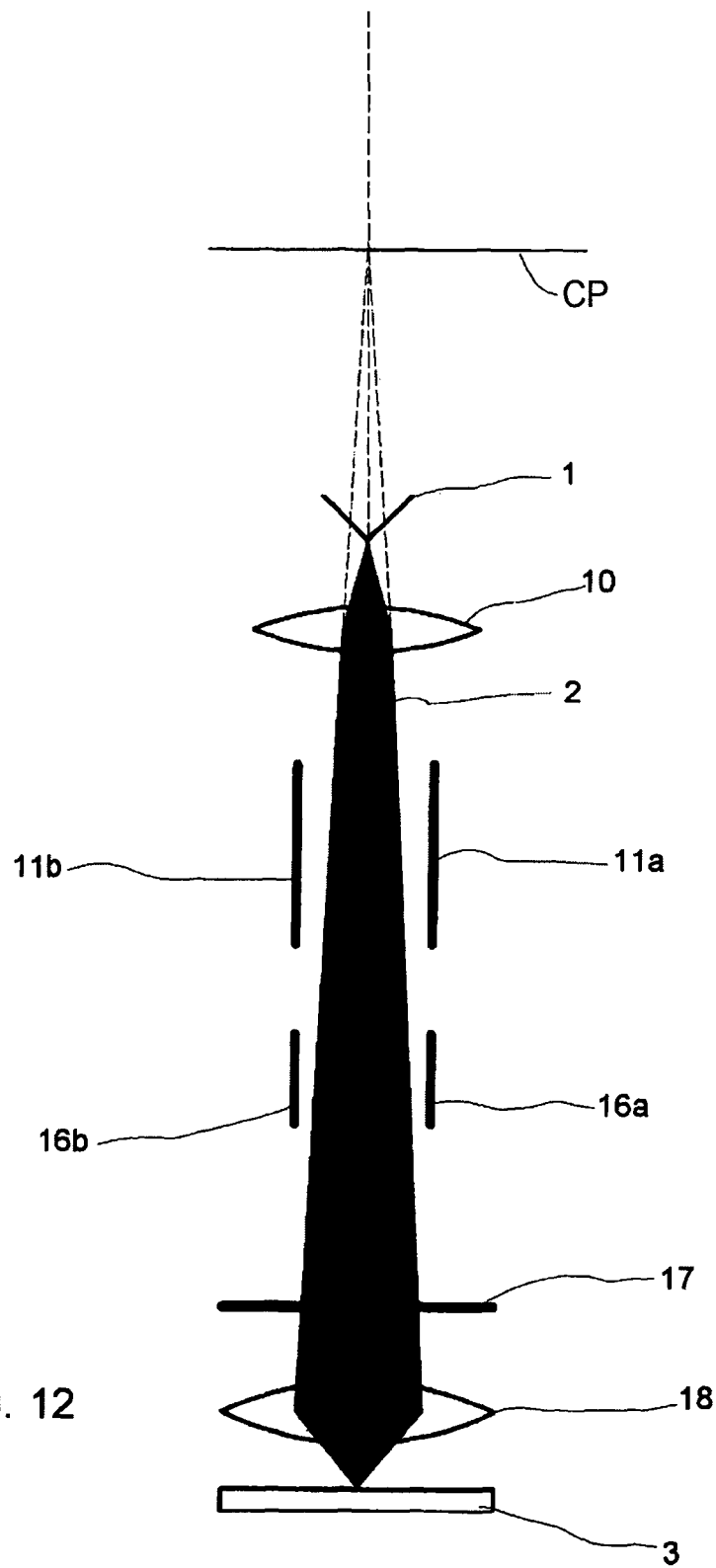
FIG. 12 shows another schematic layout of a particle beam apparatus.

The magnetic unit has pole shoe plates 14, 14a, and 15, a coil element 13a being situated between pole shoe plates 14 and 14a while another coil element 13b is situated between pole shoe plates 14a and 15. Coil element 13a includes a first region in which a first magnetic field $B_+$ is generated which is oriented axially to beam axis 8. However, coil element 13b includes a second region in which a second magnetic field $B_-$ is generated which is oriented axially to beam axis 8. The two magnetic fields $B_+$ and $B_-$ are oppositely directed, which is made clear by the corresponding arrows in FIG. 5. Here also the magnetic field composed of the two magnetic fields $B_+$ and $B_-$ has an effective length l, which is identified accordingly in FIG. 5. The exact curve of magnetic field B, which is on the order of magnitude of a few milliteslas, is shown in FIG. 10. The magnetic field intensity is plotted in that figure as a function of the z axis, which runs along beam axis 8 or the optical axis. Here the zero point is the center of magnetic unit 12. The position of pole shoe plate 14 is approximately z=50 mm, the position of pole shoe plate 15 is approximately z=−50 mm, and the position of pole shoe plate 14a is approximately z=0 mm. The effective length/for this exemplary embodiment is therefore approximately 100 mm. For this exemplary embodiment also, penetration of magnetic fields $B_+$ and $B_-$ is also provided, which is apparent in FIG. 10. Thus FIG. 10 shows the approximate positions of first deflector plates 11a and 11b as well as second deflector plates 16a and 16b, at which a certain magnetic field $B_+$ or $B_-$ still exists.

In the exemplary embodiment depicted here, the relative orientation of the two deflection elements (i.e., the relative direction of the first deflection element and the second deflection element) is 180°, the voltage ratio here being $V_1/V_2=1$. But the orientation of the two deflection elements depends on the intensity in magnetic unit 12. Should magnetic unit 12 be designed for high intensity, for example, so that a Larmor precession of 50° may be achieved, for example, then the relative orientation of the two deflection elements must be changed accordingly (for example, to 230°).

In the exemplary embodiment depicted in FIG. 5, the virtual conjugate plane CP cannot offhandedly be adjusted and shifted, because no condenser lens is provided. For this reason, in the exemplary embodiment depicted here, the two magnetic regions with magnetic fields $B_+$ and $B_-$, oriented opposite to each other and parallel to beam axis 8, were selected, the magnitudes of magnetic fields $B_+$ and $B_-$ being approximately the same.

In the exemplary embodiment depicted in FIG. 5, it is possible to adjust the axial position of the virtual pivot point of the deflection of particle beam 2 on beam axis 8 in two ways. First, the axial position of the virtual pivot point may result from suitably selecting $B_+$ and $B_-$. Because the refraction power does not involve a sign and the magnetic field dependence of the Larmor precession does involve a sign, by suitably selecting $B_+$ and $B_-$, the refraction power may be increased in such a way that again the ratio of the deflection amplitudes for both deflection elements required for deflection without drift of the particle beam may be obtained. This means that for this exemplary embodiment also the virtual pivot point may again lie in the virtual conjugate plane CP. In other words, an adjustment may be made to the length of the deflection elements via the refraction power with the aid of magnetic fields $B_+$ and $B_-$, whereby the Larmor precession remains the same. When the difference between magnetic fields $B_+$ and $B_-$ is small, an adjustment to the relative orientation of the two deflection elements is made, whereby the refraction power is only insignificantly changed.

In addition, the axial position of the virtual pivot point may be adjusted by suitably selecting the amplitude ratio of deflection voltages V1 and V2, which are provided by a first voltage supply unit 6 and a second voltage supply unit 7. First, the axial position of the virtual pivot point is again "roughly" predefined by the length, the distance between, and the polarity of first deflector plates 11a, 11b and second deflector plates 16a and 16b. The orientation or deflection of particle beam 2 is then adjusted, using the ratio of the deflection amplitudes of the two deflection elements (as indicated above), which is adjustable with the aid of first voltage supply unit 6 and second voltage supply unit 7, in such a way that the virtual pivot point lies on beam axis 8 (i.e., the axial position) in the virtual conjugate plane CP (in the depicted exemplary embodiment, this is located at beam source 1). A fine adjustment may be made with the aid of both magnetic fields B+ and B−. It is again explicitly pointed out that, for the exemplary embodiment according to FIG. 5, adjusting the axial position of the virtual pivot point with the aid of magnetic fields $B_+$ and $B_-$ is not mandatory, since the pivot point may also be adjusted by suitably selecting the ratio of the two voltages V1 and V2.

Figure 6:
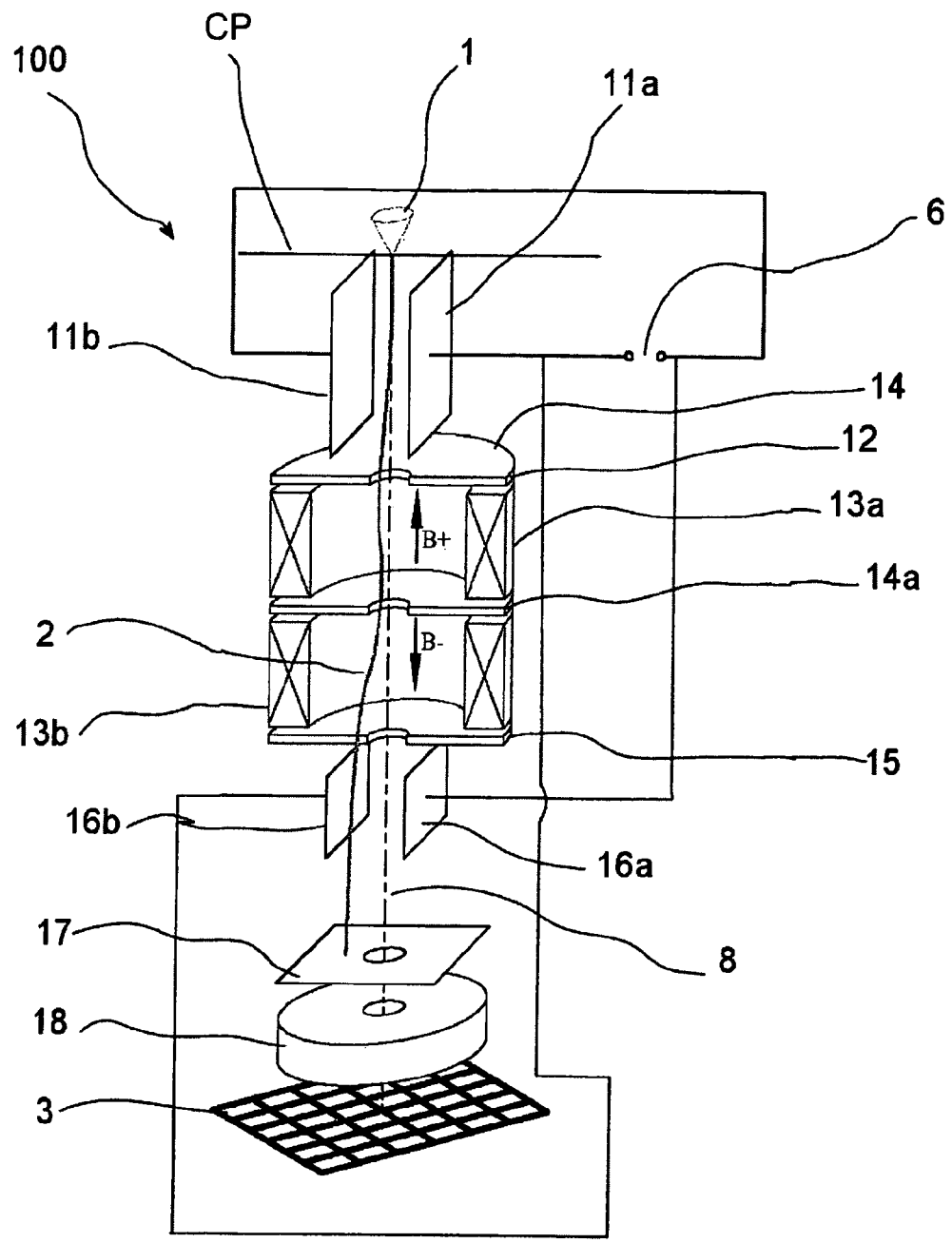
FIG. 6 shows a particle beam apparatus as in FIG. 5, but having only one voltage supply unit.

FIG. 6 depicts an exemplary embodiment which is very similar to the exemplary embodiment depicted in FIG. 5, where again the same components are provided with the same reference numerals. However, in the exemplary embodiment depicted in FIG. 6, only a single voltage supply unit is provided, namely voltage supply unit 6, for powering the first and the second pair of deflector plates 11a, 11b and 16a, 16b. In contrast to the exemplary embodiment according to FIG. 5, the virtual pivot point is adjusted in the exemplary embodiment according to FIG. 6 by suitably selecting $B_+$ and $B_-$. No adjustment of the voltage ratio is made. The advantages already indicated above are also achieved using this exemplary embodiment.

Figure 7:
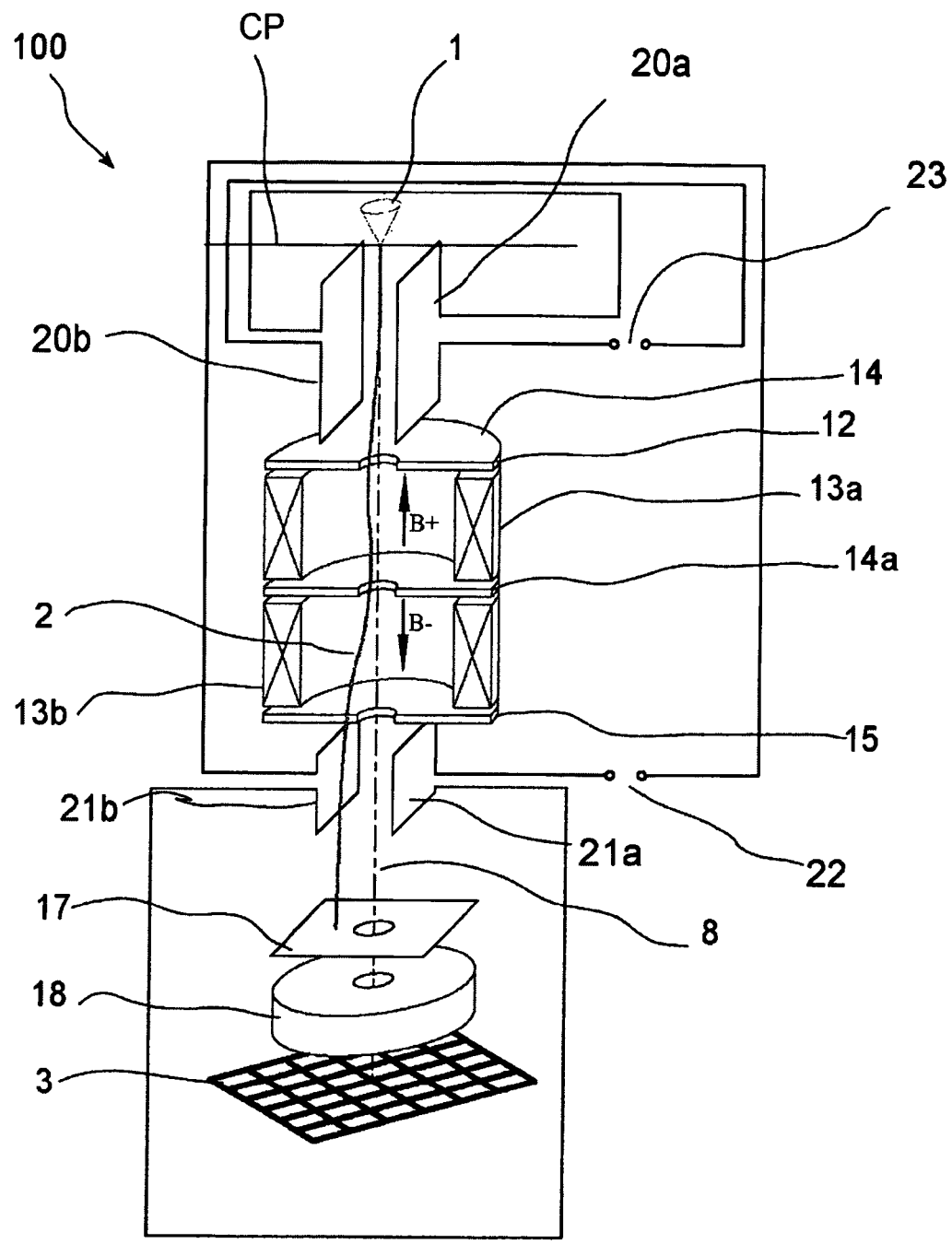
FIG. 7 shows a particle beam apparatus as in FIG. 5, but having coil elements.

FIG. 7 depicts another exemplary embodiment very similar to the exemplary embodiment according to FIG. 5, where the same reference numerals are used to denote the same components. The exemplary embodiment depicted in FIG. 7 differs from the exemplary embodiment depicted in FIG. 5 only in that instead of deflector plates, first coil elements 20a, 20b and second coil elements 21a, 21b are used for generating a deflecting magnetic field, which are powered by the corresponding first and second power supply units 22 and 23.

The exemplary embodiments depicted in FIGS. 2 through 7 ensure that the virtual center of the deflection (virtual pivot point) of particle beam 2 may be aligned with the virtual position of the conjugate plane CP (i.e., the virtual conjugate plane). This may be achieved by changing the location of the virtual conjugate plane (see exemplary embodiments according to FIGS. 2 through 4) as well as by changing the location of the virtual pivot point (see exemplary embodiments according to FIGS. 5 through 7). In all exemplary embodiments, it is advantageous that the entire deflection of particle beam 2 in this case is attainable in such a way that as a result, the above-described "particle beam tilt" about the virtual pivot point is readily achieved. The orientation of particle beam 2 is ensured using the axial magnetic field B or $B_+$ and $B_-$ of the magnetic unit. The aforementioned measures ensure that particle beam 2 is deflected to blanking aperture 17 in such a way that drift of particle beam 2, and thus unintentional striking of object 3 by particle beam 2, is avoided. Essentially it is hereby achieved that particle beam 2 stays on object 3 or moves only within a region (for example, in a nanometer range), in which drift of particle beam 2 is avoided.

Figure 13:
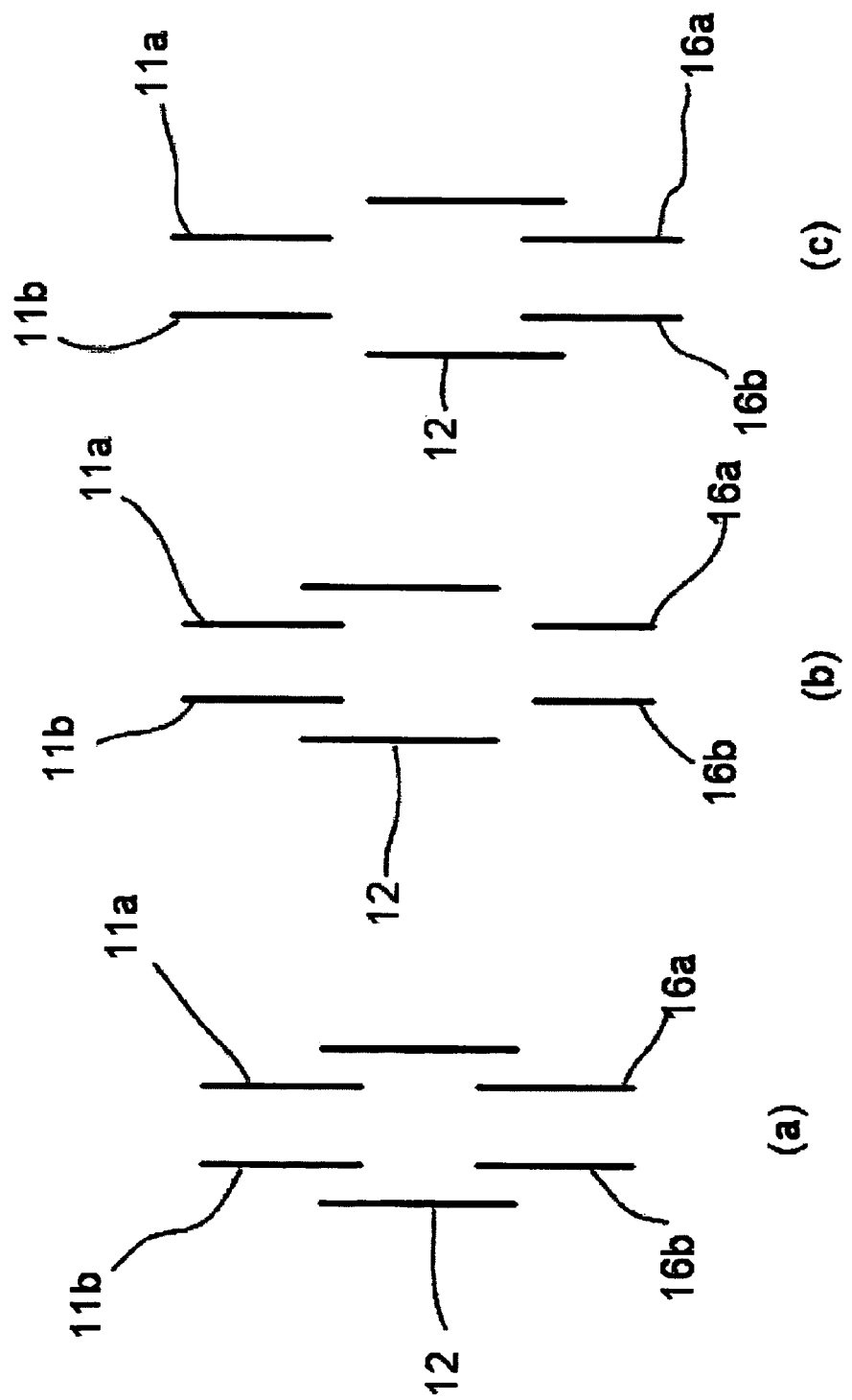
FIG. 13 shows a schematic representation of configurations of deflection elements and a magnetic unit.

FIG. 13 schematically shows other exemplary embodiments of the invention, which contain certain configurations of first deflection element 11a, 11b, second deflection element 16a, 16b, and magnetic unit 12. Thus in the exemplary embodiment according to FIG. 13a, first deflection element 11a, 11b and second deflection element 16a, 16b partially overlap magnetic unit 12. In other words, first deflection element 11a, 11b and second deflection element 16a, 16b are inserted into magnetic unit 12. FIGS. 13b and 13c show similar configurations. In these configurations, either only first deflection element 11a, 11b (FIG. 13b) or only second deflection element 16a, 16b (FIG. 13c) overlap magnetic unit 12. The embodiments according to FIG. 13 are particularly advantageous if a lens that already exists in a particle beam apparatus is used as magnetic unit 12. It ensures that the invention functions properly even with little available installation space.

Figure 8:
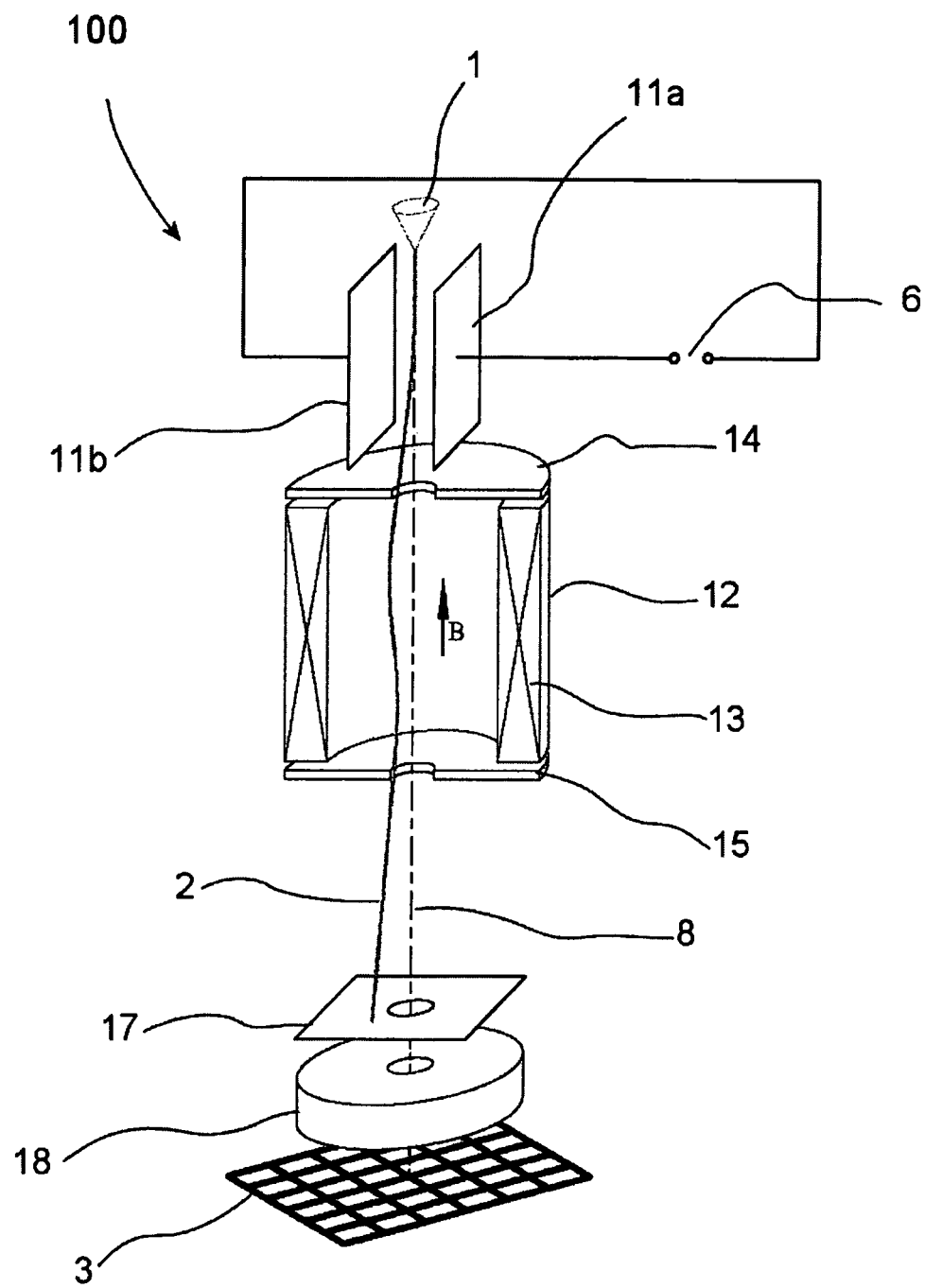
FIG. 8 shows a particle beam apparatus having another device for deflecting a particle beam.

Another particle beam apparatus according to the invention, in the form of a sample processing apparatus 100, is depicted in FIG. 8. The same components in this case are again provided with the same reference numerals. Particle beam apparatus 100 according to FIG. 8 has a beam source 1 for generating a particle beam 2. This particle beam apparatus 100 also has a special configuration of its components along beam axis 8. As viewed from beam generator 1, first a first deflection element 11a, 11b and then magnetic unit 12 are situated along beam axis 8 behind beam generator 1. The first deflection element has two opposite deflector plates 11a and 11b, which form a pair of deflector plates. Magnetic unit 12 has pole shoe plates 14 and 15, between which coil element 13 is situated.

Again as viewed from beam generator 1 along beam axis 8, situated behind magnetic unit 12 are blanking aperture 17, objective lens 18, as well as object 3, which is located in an object plane. Thus, this exemplary embodiment, as viewed from beam generator 1 along beam axis 8, has the following configuration, in order: first deflection element having first deflector plates 11a, 11b—magnetic unit 12—blanking aperture 17—objective lens 18—object 3.

First deflector plates 11a and 11b are powered by a voltage supply unit 6 via leads.

The magnetic field provided by magnetic unit 12 is oriented parallel to beam axis 8 (i.e., axial to beam axis 8, also see explanations above) and is adjusted in such a way that a Larmor precession of up to ±90° is achieved. Magnetic field B is designed in such a way that it penetrates the first deflection element having first deflector plates 11a and 11b. In an alternative embodiment, it is provided that the first deflection element is situated far away from magnetic field B, so that penetration is negligible or does not occur at all. The invention is therefore not limited to a penetrating magnetic field B.

Because of the first deflection element having the two first deflector plates 11a and 11b and the axially oriented magnetic field B, no undesired exposures of object 3 may occur during blanking of particle beam 2. Due to first deflection element 11a, 11b and magnetic field B, particle beam 2 is guided during blanking in a direction in which additional exposure is not an issue. Because of the possibility that deflection element 11a, 11b may be accordingly affected (for example, by a reversal in polarity), a Larmor precession of magnetic field B of max. ±90° is sufficient, in order to adjust any possible direction of deflection of particle beam 2 during blanking.

The provided magnetic field B is preferably adjustable in such a way that a Larmor precession of exactly 145° is achieved. This embodiment ensures, using a correspondingly controlled deflection element 11a, 11b, that particle beam 2 is oriented in certain preferred directions.

In this exemplary embodiment, magnetic unit 12 is designed as a magnetic round lens which performs other tasks in particle beam apparatus 100 and thus takes on only one additional function according to the invention. In this case, the geometry and energizing of the round magnetic lens are selected in such a way that the desired Larmor precession (for example, ±45°) results.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A device for deflecting a particle beam away from a beam axis or for guiding a particle beam toward the beam axis, comprising:
    at least one first deflection element;
    at least one magnetic unit to provide a magnetic field;
    at least one second deflection element, wherein, as viewed from the first deflection element, the magnetic unit and the second deflection element are situated along the beam axis, and wherein the magnetic field is oriented parallel to the beam axis; and
    at least one blanking unit which, as viewed from the first deflection element, is situated behind the second deflection element, wherein the magnetic field is provided by the magnetic unit such that the particle beam is deflected to the blanking unit in such a way that a drift of the particle beam in an object plane is avoided.

2. The device as recited in claim 1, wherein the first deflection element, the magnetic unit, and the second deflection element are controllable by predefinable control parameters in such a way that, relative to a predefined reference system, a virtual center of the particle beam deflection lies in a virtual plane conjugate to an object plane.

3. The device as recited in claim 2, wherein the first deflection element, the magnetic unit, and the second deflection element are controllable by predefinable control parameters in such a way that, relative to the first deflection element, the virtual center of the particle beam deflection lies in a virtual plane conjugate to an object plane.

4. The device as recited in claim 1, wherein the blanking unit includes a blanking aperture.

5. The device as recited in claim 1, wherein the first deflection element has at least two first deflection units.

6. The device as recited in claim 1, wherein the second deflection element has at least two second deflection units.

7. The device as recited in claim 1, wherein, at least one of the following is provided: (i) two first deflection units of the first deflection element have a length along the beam axis in the range from 5 mm to 60 mm and (ii) two second deflection units of the second deflection element have a length along the beam axis in the range from 5 mm to 60 mm.

8. The device as recited in claim 1, wherein, at least one of the following is provided: (i) two first deflection units of the first deflection element are separated by a distance perpendicular to the beam axis in the range from 1 mm to 10 mm and (ii) two second deflection units of the second deflection element are separated by a distance perpendicular to the beam axis in the range from 1 mm to 10 mm.

9. The device as recited in claim 1, wherein, at least one of the following is provided: (i) the first deflection element has at least one plate-shaped first deflection unit and (ii) the second deflection element has at least one plate-shaped second deflection unit.

10. The device as recited in claim 1, wherein, at least one of the following is provided: (i) the first deflection element has at least one first magnetic element and (ii) the second deflection element has at least one second magnetic element.

11. The device as recited in claim 1, further comprising:
    a first voltage supply unit for powering the first deflection element; and
    a second voltage supply unit for powering the second deflection element.

12. The device as recited in claim 1, further comprising:
    a voltage supply unit for jointly powering both the first deflection element and the second deflection element.

13. The device as recited in claim 1, wherein the magnetic unit has at least one coil element.

14. The device as recited in claim 1, wherein the magnetic unit has at least one pole shoe.

15. The device as recited in claim 1, wherein the magnetic unit includes a round lens.

16. The device as recited in claim 1, wherein the magnetic unit has at least one first region having a first magnetic field and at least one second region having a second magnetic field, the first magnetic field being oriented opposite to the second magnetic field.

17. The device as recited in claim 16, wherein the first magnetic field has a field intensity which is different from the field intensity of the second magnetic field.

18. The device as recited in claim 1, wherein at least one of: the first deflection element and the second deflection element at least partially overlaps the magnetic unit.

19. A particle beam apparatus, comprising:
    a device for deflecting a particle beam away from a beam axis or for guiding a particle beam toward the beam axis, the device including:
        at least one first deflection element;
        at least one magnetic unit to provide a magnetic field;

at least one second deflection element, wherein, as viewed from the first deflection element, the magnetic unit and the second deflection element are situated along the beam axis, and wherein the magnetic field is oriented parallel to the beam axis; and at least one blanking unit which, as viewed from the first deflection element, is situated behind the second deflection element, wherein the magnetic field is provided by the magnetic unit such that the particle beam is deflected to the blanking unit in such a way that a drift of the particle beam in an object plane is avoided.

20. The particle beam apparatus as recited in claim 19, further comprising:

at least one particle source for generating a particle beam; and at least one objective lens.

21. The particle beam apparatus as recited in claim 20, further comprising:

at least one condenser lens.

22. The particle beam apparatus as recited in claim 19, wherein the particle beam apparatus is a lithography machine.

23. The particle beam apparatus as recited in claim 19, wherein the particle beam apparatus is an electron beam apparatus.

24. The particle beam apparatus as recited in claim 19, wherein the particle beam apparatus is an ion beam apparatus.

25. The device as recited in claim 7, wherein the length along the beam axis is in the range from 10 mm to 30 mm.

26. The device as recited in claim 8, wherein the distance perpendicular to the beam axis is in the range from 2 mm to 5 mm.

27. The device as recited in claim 1, further comprising:

an objective lens which is situated, as viewed from the second deflection element, behind the blanking unit and which focuses the particle beam onto the object plane.

28. The device as recited in claim 1, wherein the first deflection element and the second deflection element are short-circuited.

29. The device as recited in claim 1, wherein the first deflection element is provided with a first voltage, and wherein the second deflection element is provided with a second voltage, and wherein a ratio of the first voltage to the second voltage is 1 or −1.

30. The particle beam apparatus as recited in claim 19, wherein the device for deflecting the particle beam further includes:

an objective lens which is situated, as viewed from the second deflection element, behind the blanking unit and which focuses the particle beam onto the object plane.

31. The particle beam apparatus as recited in claim 19, wherein the first deflection element and the second deflection element are short-circuited.

32. The particle beam apparatus as recited in claim 19, wherein the first deflection element is provided with a first voltage, and wherein the second deflection element is provided with a second voltage, and wherein a ratio of the first voltage to the second voltage is 1 or −1.

33. A method of operating a particle beam apparatus, the particle beam apparatus including at least one particle source for generating a particle beam, a device for deflecting the particle beam away from a beam axis of the particle beam apparatus or for guiding the particle beam toward the beam axis, the device having at least one deflection element and at least one magnetic unit for providing a magnetic field which is oriented parallel to the beam axis, and at least one objective lens, wherein, as viewed from the particle source, the deflection element, the magnetic element and the objective lens are situated along the beam axis, the method comprising:

adjusting the magnetic field in such a way that the particle beam is guided during blanking in a direction in which no undesired exposures of an object occurs.

34. The method as recited in claim 33, wherein the magnetic field is adjusted in such a way that the particle beam undergoes a Larmor precession of up to ±90°.

35. The method as recited in claim 34, wherein the magnetic field is adjusted in such a way that the particle beam undergoes a Larmor precession of up to ±45°.

36. The method as recited in claim 33, wherein the magnetic field is adjusted during the blanking dependent on the object.

37. The method as recited in claim 33, wherein the particle beam device further includes a blanking unit which is situated between the magnetic unit and the objective lens.

\* \* \* \* \*